United States Patent
Zhao et al.

(10) Patent No.: US 9,136,887 B2
(45) Date of Patent: Sep. 15, 2015

(54) SUBTRACTING LINEAR IMPAIRMENTS FOR NON-LINEAR IMPAIRMENT DIGITAL PRE-DISTORTION ERROR SIGNAL

(71) Applicant: Texas Instruments Incorporated, Dallas, TX (US)

(72) Inventors: Hongzhi Zhao, San Jose, CA (US); Xiaohan Chen, Sunnyvale, CA (US); Zigang Yang, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/185,888

(22) Filed: Feb. 20, 2014

(65) Prior Publication Data

US 2015/0236730 A1     Aug. 20, 2015

(51) Int. Cl.
    H04K 1/02         (2006.01)
    H04B 1/04         (2006.01)

(52) U.S. Cl.
    CPC ................... H04B 1/0475 (2013.01)

(58) Field of Classification Search
    CPC ............. H03F 1/3247; H03F 1/3294; H03F 2201/3233; H04L 27/368; H04L 25/03343
    USPC ....................................................... 375/296
    See application file for complete search history.

(56) References Cited

U.S. PATENT DOCUMENTS

| | | | |
|---|---|---|---|
| 6,054,894 A | | 4/2000 | Wright et al. |
| 6,072,364 A * | | 6/2000 | Jeckeln et al. ............... 330/149 |
| 6,798,843 B1 * | | 9/2004 | Wright et al. ............... 375/296 |
| 6,937,669 B2 * | | 8/2005 | Tomerlin et al. ............ 375/297 |
| 7,016,489 B1 | | 3/2006 | Larsen |
| 7,136,628 B2 * | | 11/2006 | Yang et al. ................ 455/114.3 |
| 7,904,033 B1 * | | 3/2011 | Wright et al. ............. 455/114.2 |
| 8,185,065 B2 * | | 5/2012 | McCallister et al. ...... 455/114.2 |
| 8,446,979 B1 * | | 5/2013 | Yee .............................. 375/296 |
| 8,478,210 B2 * | | 7/2013 | Gandhi et al. ............ 455/114.3 |
| 8,633,769 B2 * | | 1/2014 | Bai et al. ..................... 330/149 |
| 2003/0058959 A1 * | | 3/2003 | Rafie et al. .................. 375/296 |
| 2006/0209985 A1 | | 9/2006 | Kang |
| 2009/0146736 A1 * | | 6/2009 | Kim et al. .................... 330/149 |
| 2010/0225390 A1 * | | 9/2010 | Brown et al. ................ 330/149 |
| 2010/0232493 A1 | | 9/2010 | Thirumoorthy |
| 2013/0077713 A1 * | | 3/2013 | Kim et al. .................... 375/297 |
| 2014/0294120 A1 * | | 10/2014 | Gandhi et al. .............. 375/297 |

FOREIGN PATENT DOCUMENTS

EP          1860770 A       11/2007
WO       2011077246 A2       6/2011

* cited by examiner

*Primary Examiner* — Juan A Torres
(74) *Attorney, Agent, or Firm* — Lawrence J. Bassuk; Charles A. Brill; Frank D. Cimino

(57) ABSTRACT

Example embodiment of the systems and methods of linear impairment modeling to improve digital pre-distortion adaptation performance includes a DPD module that is modified during each sample by a DPD adaptation engine. A linear impairment modeling module separates the linear and non-linear errors introduced in the power amplifier. The linear impairment model is adjusted during each sample using inputs from the input signal and from a FB post processing module. The linear impairment modeling module removes the linear errors such that the DPD adaptation engine only adapts the DPD module based on the non-linear errors. This increases system stability and allows for the correction of IQ imbalance inside the linear impairment modeling, simplifying the feedback post-processing.

6 Claims, 7 Drawing Sheets

SUBTRACTING LINEAR IMPAIRMENTS FOR NON-LINEAR IMPAIRMENT DIGITAL PRE-DISTORTION ERROR SIGNAL

TECHNICAL FIELD

The present disclosure is generally related to radio frequency (RF) communication and, more particularly, is related to improving efficiency in power amplification of a radio frequency (RF) signal.

BACKGROUND

Present day wireless communication applications demand high speed data transmissions. This is made possible by multilevel modulation schemes like Phase Shift Keying (PSK) and Quadrature Amplitude Modulation (QAM). The non-linear effects in RF amplifiers such as gain compression cause power efficiency problems especially in multilevel modulation scheme causing a trade off. There are methods to compensate for these non-linear effects.

In one compensation method, the input power to the amplifier is decreased, but this leads to power efficiency losses. Compound semiconductors like GaAs can also be used in the RF amplifiers, but that will increase the cost of the amplifier, making it unsuitable for low cost and small scale integrated circuit implementations.

One type of digital modulation, PSK, uses distinct phases and each of these phases represents a unique symbol pattern of bits. There are in-phase and quadrature components of the modulated signal. Generally, after modulation, the symbols will be complex (x+iy). If the signal values fall beyond a particular threshold in the scatterplot then it will be detected as another symbol thus causing errors.

QAM is both a digital scheme as well as an analog scheme. It conveys two analog signals or digital bit streams using amplitude shift keying and these are usually 90 degrees out of phase—and so the name quadrature. The gain in RF amplifiers is not linear. At higher input levels the gain tends to saturate. This effect is called gain compression and the parameter to signify gain compression is called the 1 dB compression point. The 1 dB compression point may be defined as the input power at which the output is 1 dB less than the expected value. The system equation of a linear power amplifier may be given as $$y(t)=a1*x(t) \quad (1)$$

The system equation of the RF amplifiers can be generalized due to non-linearities as:

$$y(t)=a1*x(t)+a2*x^2(t)+a3*x^3(t) \quad (2)$$

Gain compression causes errors in both amplitude and phase (because the symbols generally of the form x+iy and x and y are separately amplified). To have a high speed data rate, multilevel modulation schemes may be used. The previous observations show that effects of non-linearity in RF amplifiers cause severe performance losses for these modulation schemes. There are heretofore unaddressed needs with previous solutions.

SUMMARY

Example embodiments of the present disclosure provide systems of linear impairment modeling to improve digital pre-distortion adaptation performance. Briefly described, in architecture, one example embodiment of the system, among others, can be implemented as follows: a digital pre-distortion (DPD) module configured to receive a radio frequency (RF) input signal and apply an algorithm to filter the RF input signal to produce a filtered RF input signal; a power amplifier configured to amplify the filtered RF input signal to produce an RF output signal; a feedback post-processing module configured to sample the RF output signal and process the sampled signal; a linear impairment modeling module configured to separate a non-linear error and a linear error of the input signal; and a DPD adaptation engine configured to update the DPD algorithm based on an output of the linear impairment modeling module and an output of the feedback post-processing module.

Embodiments of the present disclosure can also be viewed as providing methods for linear impairment modeling to improve digital pre-distortion adaptation performance. In this regard, one embodiment of such a method, among others, can be broadly summarized by the following steps: receiving a radio frequency (RF) input signal; applying digital pre-distortion (DPD) processing to the RF input signal to produce a DPD signal; amplifying the DPD signal with a power amplifier to produce an RF output signal; processing a feedback signal from the RF output signal; applying a linear impairment model to the RF input signal; combining the processed feedback signal and the output of the linear impairment model to produce a DPD error; and updating the DPD processing with the DPD error.

DETAILED DESCRIPTION

Figure 1:
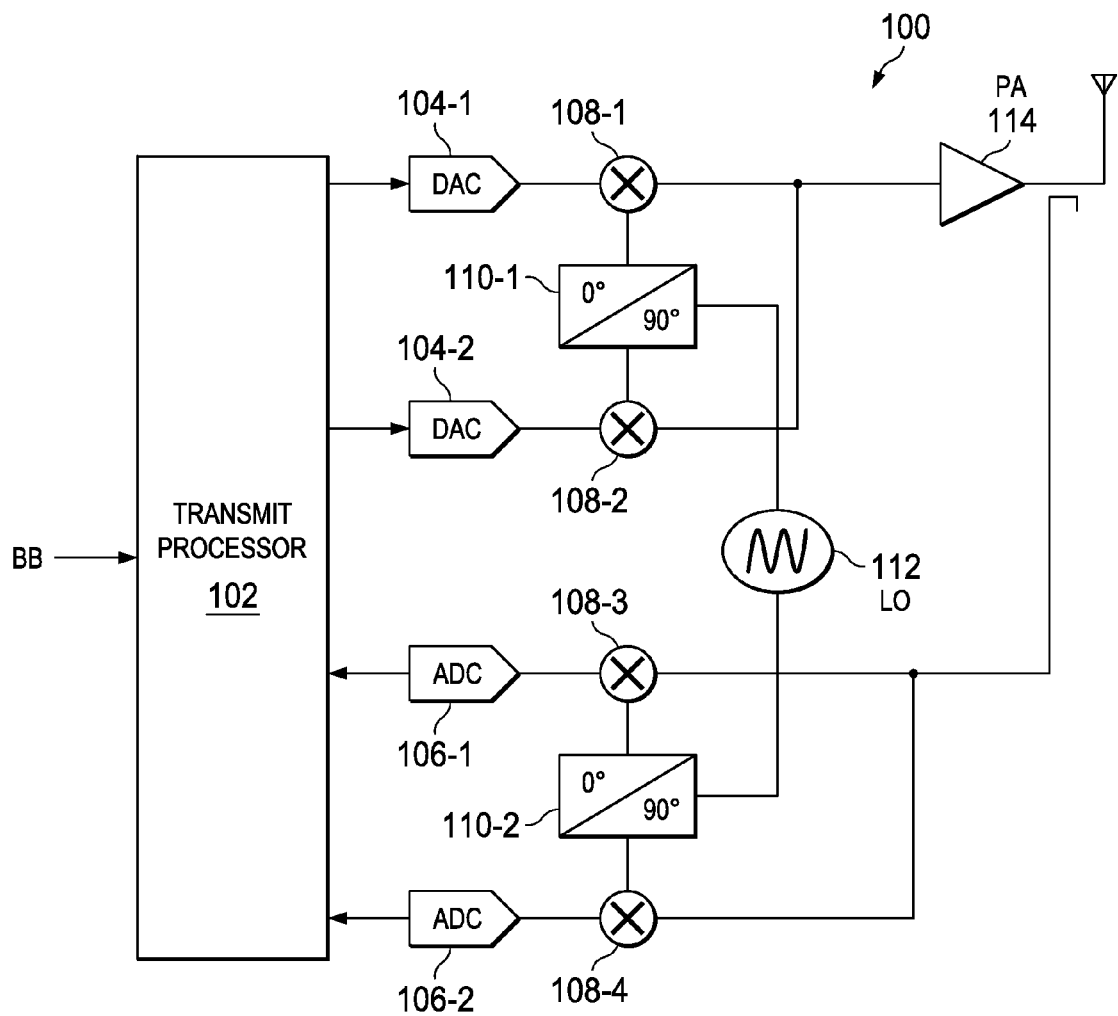
FIG. 1 is a block diagram of an example embodiment of a DPD system.

Embodiments of the present disclosure will be described more fully hereinafter with reference to the accompanying drawings in which like numerals represent like elements throughout the several figures, and in which example embodiments are shown. Embodiments of the claims may, however, be embodied in many different forms and should not be construed as limited to the embodiments set forth herein. The examples set forth herein are non-limiting examples and are merely examples among other possible examples.

In order to counteract the distortion introduced to an input signal by a power amplifier in an envelope tracking system, techniques have been developed for injecting a predistortion signal into an input signal's path prior to amplification. The predistortion signal includes components equal and opposite to the distortion introduced by the power amplifier and are designed to cancel the distortion introduced to the input signal by the power amplifier.

A typical linear power amplification system includes an envelope detector, a tracking power supply coupled to the envelope detector, an input signal conditioner apparatus, and a power amplifier (PA). The PA is preferably coupled to an antenna (or antenna array) for wireless transmission of an amplified, output signal. The system may also include delay circuits.

The envelope detector and tracking power supply may be utilized to track a signal input into the system and to provide a variable supply voltage to the power amplifier. A variable supply voltage is designed to maintain the power amplifier output at or near saturation and to increase the efficiency of the power amplifier over a wide range of variation of the input signal. However, the variation of the supply voltage supplied to the PA may cause gain and phase distortions to be introduced to the amplified signal by the PA.

In order to counteract the gain and phase distortions introduced by the PA, an input signal conditioner predistorts, or conditions, the input signal. The input signal conditioner may include one or more of a nonlinear phase mapper, a phase adjuster, a nonlinear gain mapper, and a gain adjuster. Variations in gain and phase in the output signal may be correlated to, or otherwise occur as, a function of the supply voltage sourced to the PA. The variations in gain and phase of the output signal may be calibrated or otherwise empirically determined as a function of the supply voltage to create nonlinear phase and gain mappings that are respectively implemented in the nonlinear phase mapper and the nonlinear gain mapper.

The non-linear phase mapper and non-linear gain mapper may then be used to adjust the transfer functions of the phase adjuster and the gain adjuster, respectively, based on the supply voltage sourced to the PA. By adjusting the transfer functions of the phase adjuster and gain adjuster, the phase and gain of the input signal can be adjusted in such a manner as to counteract the gain and phase distortions introduced to the input signal at varying supply voltages by the PA.

Example embodiments of the systems and methods of linear impairment modeling to improve digital pre-distortion (DPD) adaptation performance disclosed herein involves feedback linear modeling to increase the performance and stability of DPD adaption. PA efficiency is improved by using the performance and stability DPD to suppress RF power amplifier non-linear frequency re-growth. To increase the PA efficiency, the systems and methods disclosed herein uses RF feedback loop modeling to remove the linear error and uses only the non-linear errors to adapt the DPD.

In an example implementation, a cellular network system deploys an RF PA to transmit an RF signal from a base station to a mobile phone. Digital pre-distortion systems can improve RF amplifier efficiency by using a pre-distortion module to suppress spectrum re-growth generated by power amplifier saturation. The RF impairments exist in both transmit and feedback path, and will affect the DPD performance. The in-band error is drifting much faster than the non-linearity over time and part of the drifting is due to phase and gain variation over time.

Previous methods have used joint linear and non-linear error to perform adaptation and a feedback equalizer to equalize the channel frequency-dependent response characteristics. In the previous systems, the DPD performance has been limited by the in-band error. Stability issues arise due to power amplifier non-linear and linear signals showing finite correlation. They also sacrifice PA efficiency to meet specified parameters.

Example embodiments of the systems and methods disclosed herein implement a linear impairment model to effectively separate the non-linear errors and linear errors which optimize the DPD performance and increase the system stability. The linear impairments are from analog filter component frequency response characteristics and IQ imbalance. Referring to FIG. 1, the linear impairments use the traffic signal X and feedback to train a complex equalizer by minimizing the error between the output of the equalizer and the amplifier feedback. DPD will use the error with the linear in-band error removed to focus on the non-linearity correction which improves the DPD performance. After subtracting the linear impairment, the error used for DPD adaptation only contains the non-linear error. In the systems and methods disclosed herein, the linear impairment model removes the linear error before the DPD adaptation is performed.

Example embodiments of the disclosure implement a linear impairment model to remove the linear errors so that the DPD model can focus on the non-linearity correction, which optimizes the DPD performance and increases the system stability at reduced costs. This idea can be extended to include the high-ordered non-linear alias in the impairment model when DPD does not have very high sampling rate. Example Embodiments use the impairment model to model the non-linearity outside linearization bandwidth (it may present itself in terms of aliasing) so that DPD can focus on non-linearity compensation within the required linearization bandwidth and also run at a much lower rate. This idea can also be extended to any estimation or compensation problem in the presence of other structured noise.

An impairment model may be used to model the structured noise that may be left out of the compensation model in the compensator. The power amplifier non-linear spectrum components are usually 20-30 dB lower than the in-band linear spectrum components. Hence, a joint adaptation algorithm may be used to adapt the DPD block and transmit linearity equalizer. The joint adapt of DPD block and transmit linearity equalizer block experiences stability issues and DPD adjacent channel power ratio performance drifting due to PA power amplifier non-linear and linear signals showing finite correlation. For complex feedback application, the feedback equalizer training with frequency domain constraints experiences significant performance degradation when IQ imbalance components overlap with in-band components.

Loop back delay time may drift versus time and relative to different frequency components of the transmitting signals. These time delay drifts may be in the order of fractional analog to digital conversion sampling time intervals. Extra fractional delay compensations may be implemented. The accuracy of fractional delay calculation limits the DPD performance stability. The linear model that is applied to the reference signal may be accurate for the in-band signal, which greatly simplifies the channel estimation including the I and Q imbalance estimation. On the other hand, if I and Q compensation is applied inside the feedback post-processing module, the compensator may be flat-crossed across the band. The transmit signal spectrum may be defined by cellular network physical layer standards. The power amplifier output signal spectrum is a spectrum with widely spread re-growth. As DPD adaptation converges, the DPD block output signal power spectrum density is similar to the power amplifier output signal power spectrum density before DPD starts.

In a cellular network system with a power amplifier, the digital pre-distortion component may be estimated. This estimation may generate non-linear re-growth, which affects the frequency domain signal. The pre-distortion signal may be used to improve the efficiency of the power amplifier while staying within specification. However, impairments occur with the linear and non-linearity paths. Additionally, the linear errors adjust quicker than the non-linearity errors, which also affects the final DPD result. Previous methods using both linear and non-linear adaptation use an equalizer to try to compensate for the feedback impairment. However, the DPD performance is limited by the linear errors which dominate due to phase or gain variations. The overall stability can be an issue because all the linear and non-linear signals combine together. So, the adaptation is limited and will affect the stability. To meet specifications, the power amplifier efficiency is sacrificed.

Example embodiments of the methods and systems disclosed herein allow for higher power amplifier efficiency by separating the linear impairments from the non-linear impairments. The linear components may be separated from the overall error, so that only the non-linear errors are used in the DPD adaptation. Example embodiments include three main modules: A DPD module, a DPD adaptation engine, and a linear impairment modeling module. The linear impairment modeling module models the analog response with some IQ imbalance. The linear impairment model may be approximated as a linear complex filter.

The training of the impairment model may be performed online, or sample by sample. The linear impairment model may be trained using the actual input signal and the feedback from the power amplifier. The filter coefficients may be trained during each capture or sample of the traffic signal, which is the input to the DPD module. In previous designs, alignment or phase rotation was performed in fractional delay compensation in the feedback loop. Now, because the linear portion of the error has been removed, this feedback processing is not necessary. The phase changes and gain changes are removed during the linear modeling training process, improving the feedback post-processing. The DPD, the DPD adapt engine, the feedback post-processing, and the linear impairment modeling may all be performed in software on a DSP.

FIG. 1 provides conventional transmitter 100 in which transmitter 100 converts baseband signal BB to radio frequency (RF) so as to be transmitted over the transmit circuitry. As part of the conversion process, transmit processor 102 can perform crest factor reduction (CFR), digital upconversion, DPD, and other processes on baseband signal BB in the digital domain so as to generate digital I and Q signals. These digital I and Q signals are then converted to analog I and Q signals by digital-to-analog converters (DACs) 104-1 and 104-2 to generate analog signals for the modulator (i.e., mixers 108-1 and 108-2 and phase adjuster 110-1 that receive a local oscillator signal from local oscillator (LO) 112). The modulator then generates the RF signal for power amplifier (PA) 114. PA 114, however, is nonlinear, so the transmit processor's DPD correction allows for the signal to be pre-distorted in the baseband to compensate for nonlinearities in PA 114.

To perform this DPD correction, transmitter 100 employs a feedback system, namely feedback circuitry. The feedback circuitry generally comprises analog-to-digital converters (ADCs) 106-1 and 106-2 and a demodulator (which includes mixers 108-3 and 108-4 and phase adjuster 110-2 that receive a local oscillator signal from LO 112). Typically, the demodulator is able to demodulate the RF output from PA 114 to generate analog I and Q feedback signals, which are then converted to digital I and Q signals by ADCs 106-1 and 106-2.

Figure 2:
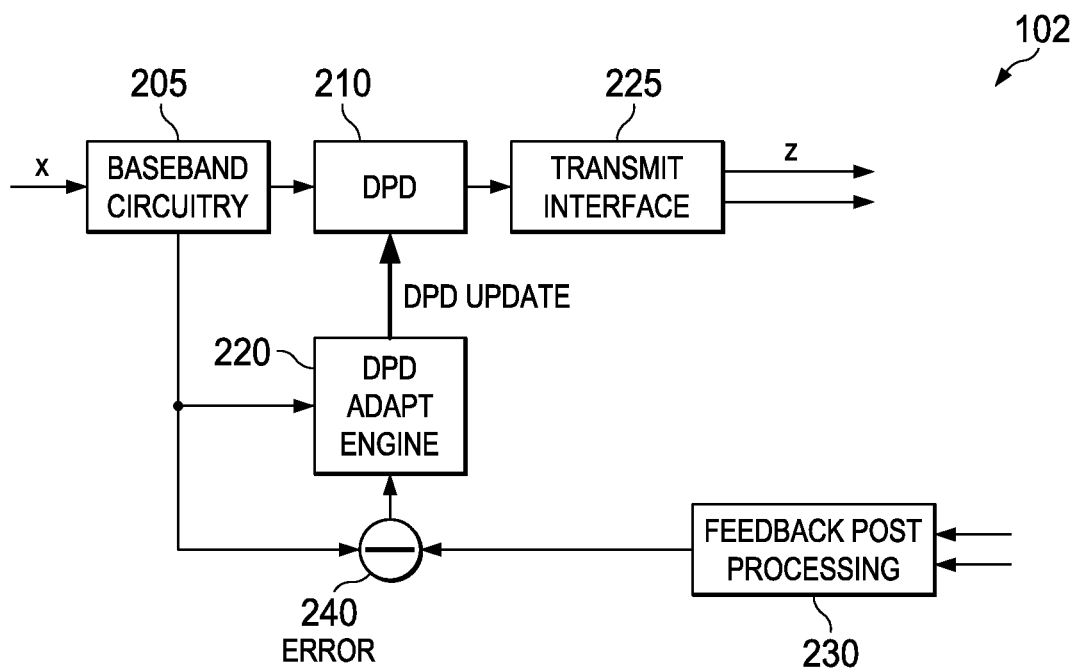
FIG. 2 is a block diagram of an example embodiment of the transmit processor of FIG. 1

Turning to FIG. 2, examples of transmit processor 102 can be seen in greater detail. As shown, the transmit processor 102 generally includes baseband circuitry 205 (which can perform CFR and as well as other tasks), digital pre-distortion (DPD) module 210, DPD adapt engine 220, transmit interface 225 (which provides the digital I and Q transmit signals to the transmit circuitry, feedback post processing module 230 and error module 240). A cellular network system deploys high power PA 114 to transmit RF signal from a base-station to a mobile phone. DPD module 210 increases the efficiency of PA 114 to suppress spectrum re-growth generated by power amplifier saturation. DPD adapt engine 220 may use a feedback from feedback post processing module 230 to generate an error between an input signal and the feedback signal with error module 240. DPD adapt engine 220 uses this error to adapt its pre-distortion model to correlate the feedback signal equal to the transmit signal. The RF impairments exist in both transmit path and the feedback path and will affect the performance of DPD module 210. Current solution is to calculate the error between the feedback data and reference signal and to adapt the linear and nonlinear distortion jointly. Feedback post processing module 230 aligns the feedback with the reference signal in terms of RMS power, phase, integer and fractional delay. Feedback post processing module 230 may also compensate the IQ imbalance in a complex feedback system.

Figure 3A:
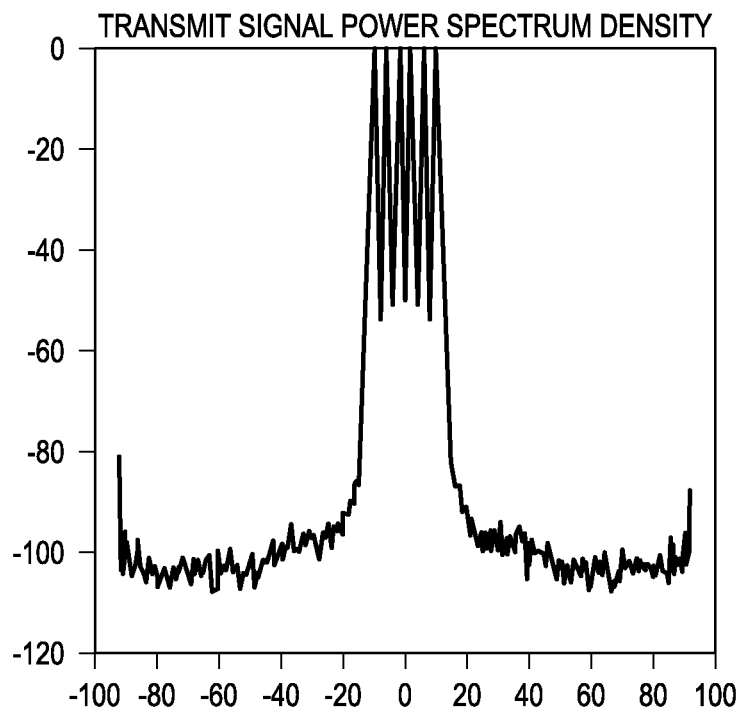
FIG. 3A is a signal diagram of a typical transmit signal power spectrum density.
Figure 3B:
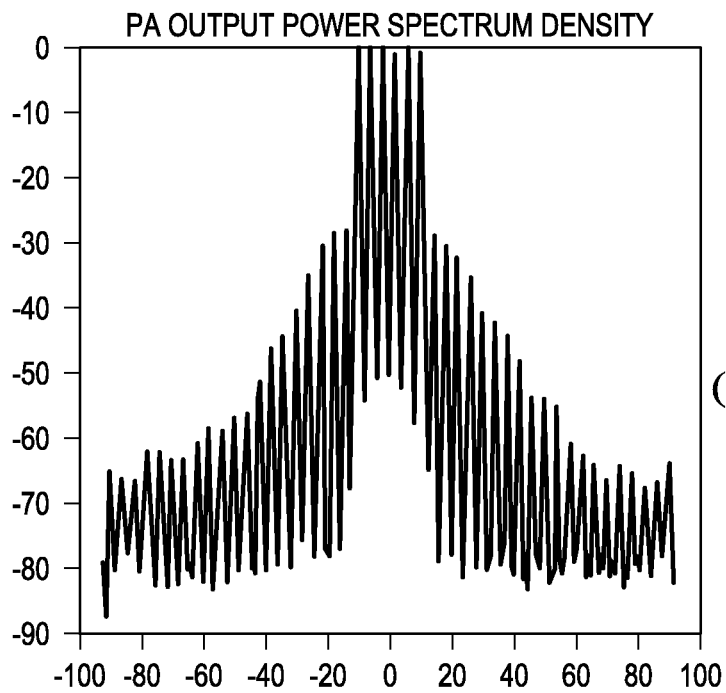
FIG. 3B is a signal diagram of a typical power amplifier output power spectrum density.

FIG. 3A provides a signal diagram of the frequency spectrum of the input signal of the PA. FIG. 3B provides a signal diagram of the frequency spectrum of the output of the PA. As the DPD adaptation converges, the DPD block output signal's power spectrum density is similar to the PA output signal power spectrum density before the DPD adaptation starts.

Figure 4A:
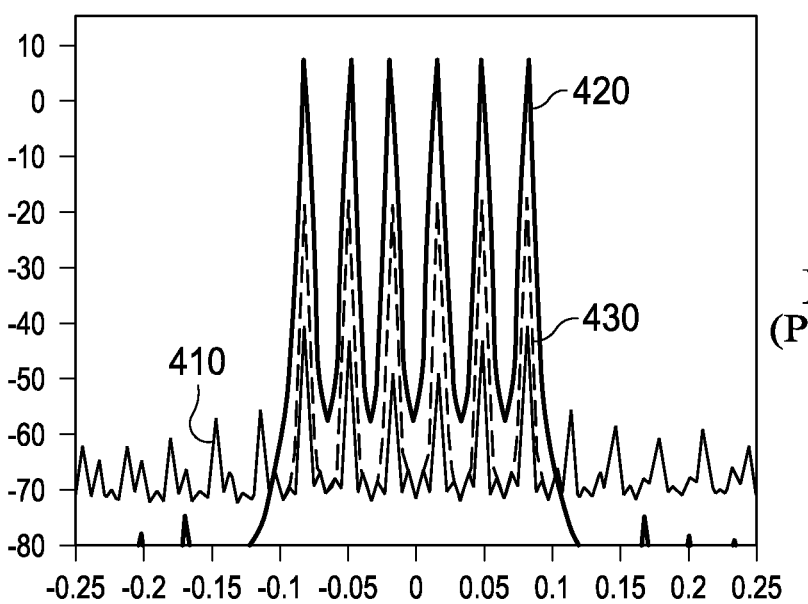
FIG. 4A is a signal diagram of a power spectral density curve of system signals.
Figure 4B:
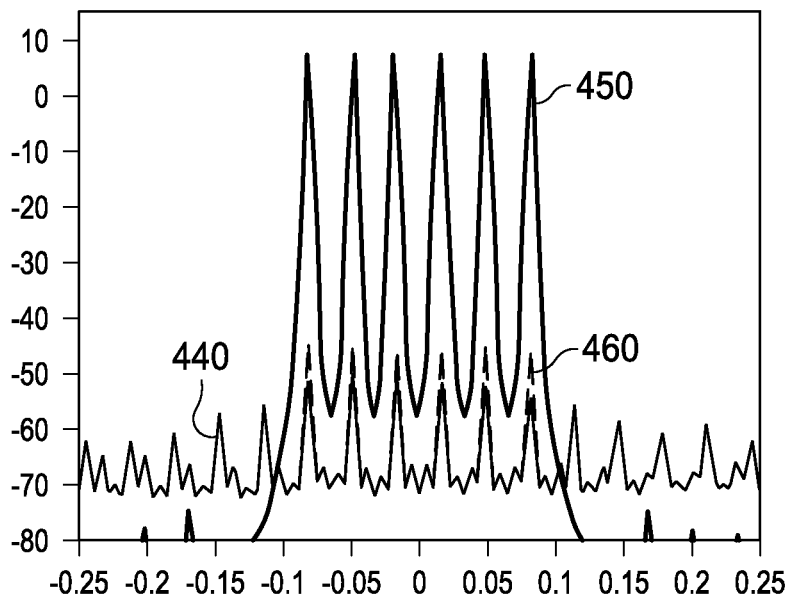
FIG. 4B is a signal diagram of a power spectral density curve of system signals.

FIG. 4A and FIG. 4B provide signal diagrams of the power spectral density curves of the error signals in a DPD system for multiple signal captures. Signals 420 and 450 represent the digital reference signal power. Signals 430 and 460 represent the error between the feedback signal and the reference signals 420 and 450. Signals 410 and 440 represent the error after alignment in phase and gain. The stability changes over time. The error indicates that the error is drifting faster than the non-linearity and that the drifting is due to phase and gain variation over time.

Figure 5:
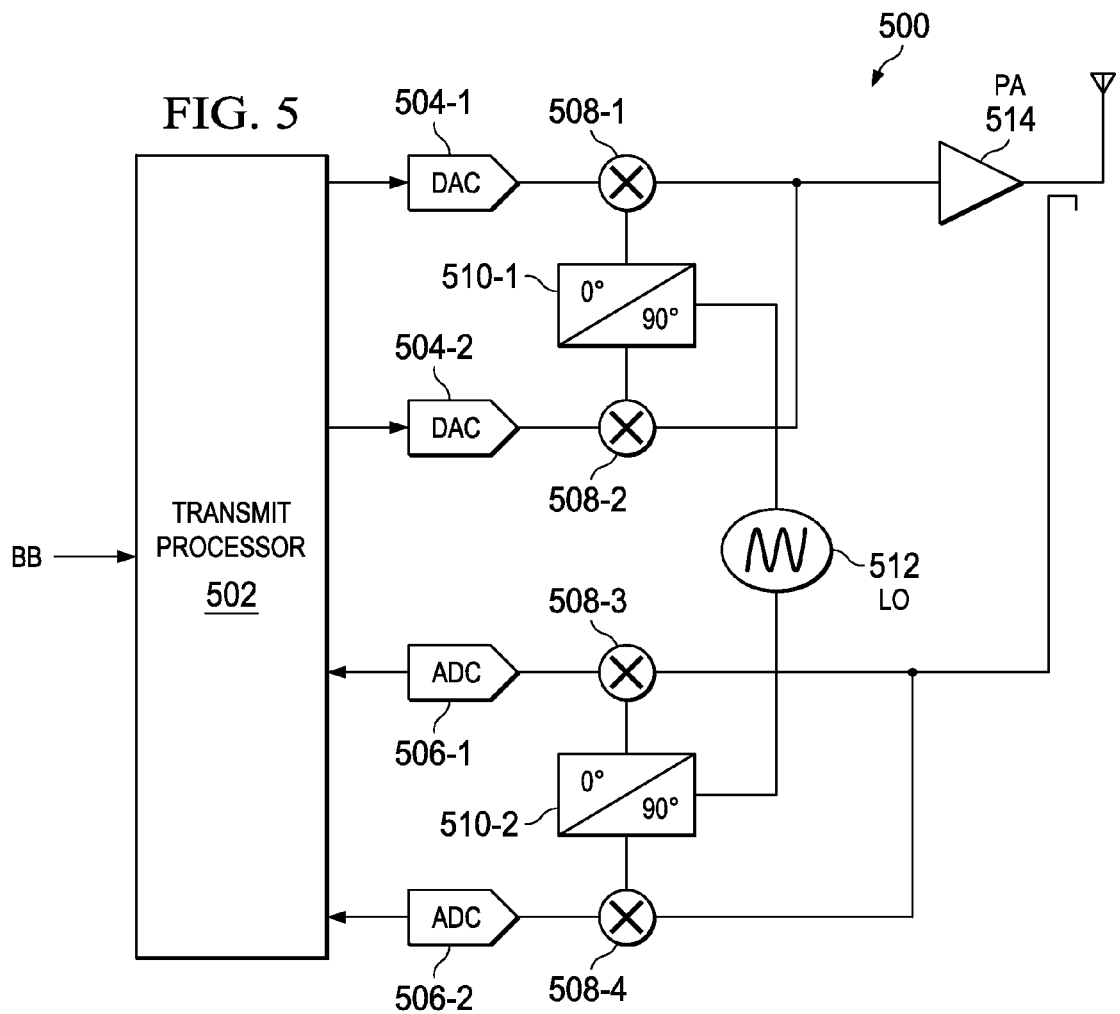
FIG. 5 is a block diagram of an example embodiment of a system of linear impairment modeling to improve digital pre-distortion adaptation performance.

FIG. 5 provides an example embodiment of transmitter 500 of the disclosed systems and methods of linear impairment modeling to improve digital pre-distortion adaptation performance. Transmitter 500 is similar to transmitter 100, except that transmitter 500 includes transmit processor 502 that employs a linear impairment modeling module as shown in FIG. 6.

FIG. 5 provides transmitter 500 in which transmitter 500 converts baseband signal BB to radio frequency (RF) so as to be transmitted over the transmit circuitry. Transmit processor 502 generates digital I and Q signals. These digital I and Q signals are then converted to analog I and Q signals by digital-to-analog converters (DACs) 504-1 and 504-2 to generate analog signals for the modulator (i.e., mixers 508-1 and 508-2 and phase adjuster 510-1 that receive a local oscillator signal from local oscillator (LO) 512). The modulator then generates the RF signal for power amplifier (PA) 514. PA 514, however, is nonlinear, so the transmit processor's DPD correction allows for the signal to be predistorted in the baseband to compensate for nonlinearities in PA 514.

To perform this DPD correction, transmitter 500 employs a feedback system, namely feedback circuitry. The feedback circuitry generally comprises analog-to-digital converters (ADCs) 506-1 and 506-2 and a demodulator (which includes mixers 508-3 and 508-4 and phase adjuster 510-2 that receive a local oscillator signal from LO 512). Typically, the demodulator is able to demodulate the RF output from PA 514 to generate analog I and Q feedback signals, which are then converted to digital I and Q signals by ADCs 506-1 and 506-2.

Figure 6:
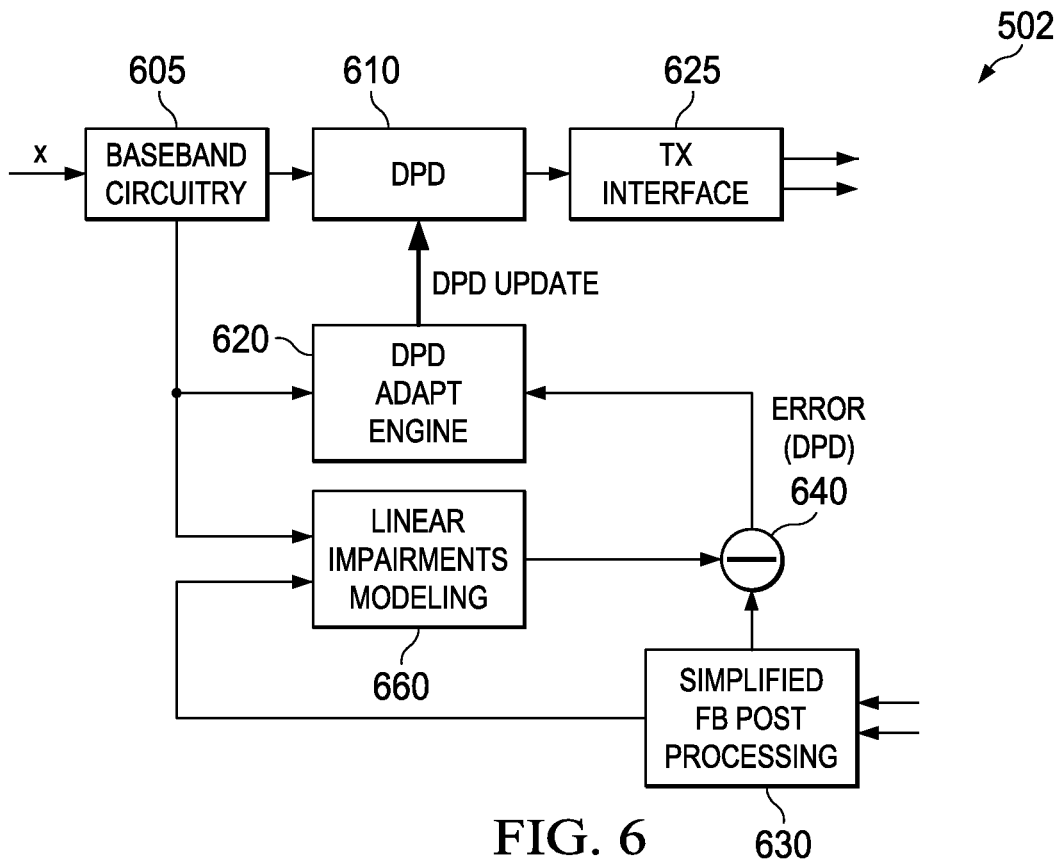
FIG. 6 is a block diagram of an example embodiment of the transmit processor of FIG. 5.

FIG. 6 provides a block diagram of transmit processor 502, an example embodiment of the systems of linear impairment modeling to improve digital pre-distortion adaptation performance. Transmit processor 502 includes baseband circuitry 605, DPD module 610, DPD adaptation engine 620, transmit interface 625, feedback post processing 630, linear impairment modeling module 660, and DPD error module 640. DPD module 610 corrects for errors that are introduced by PA 514. DPD module 610 is modified during each sample by DPD adaptation engine 620. Linear impairments modeling module 660 separates the linear and non-linear errors using inputs from the input signal and from FB post processing module 630. Linear impairment modeling module 660 removes the linear errors such that DPD adaptation engine 620 only adapts DPD module 610 based on the non-linear errors. This increases system stability and allows for the correction of IQ imbalance inside the linear impairment modeling, simplifying the feedback post-processing.

Figure 7A:
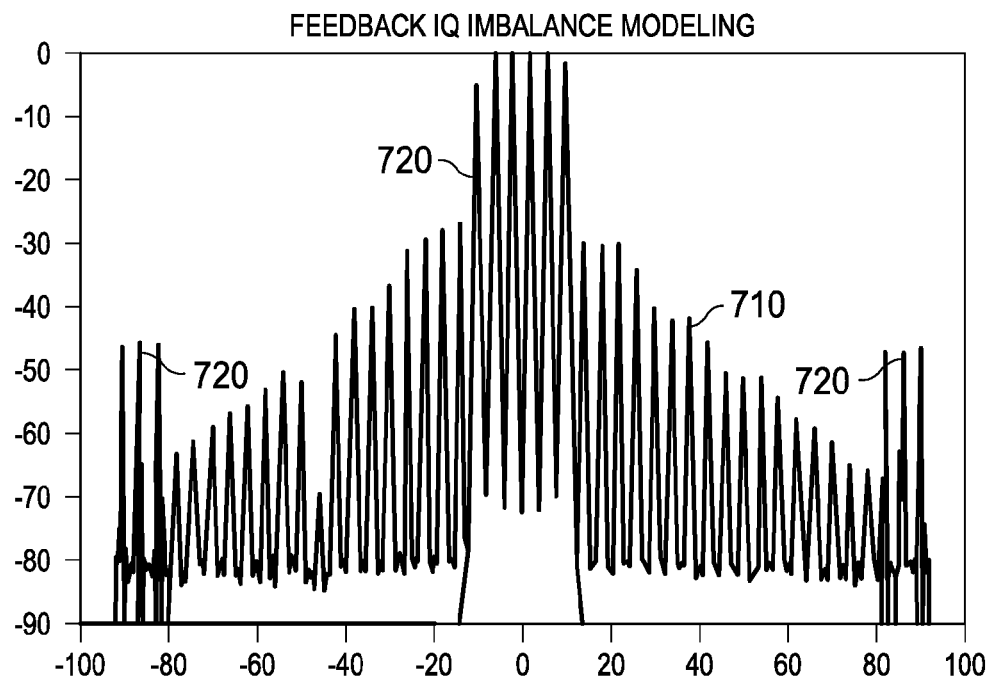
FIG. 7A is a signal diagram of a power spectral density curve of received feedback signals.
Figure 7B:
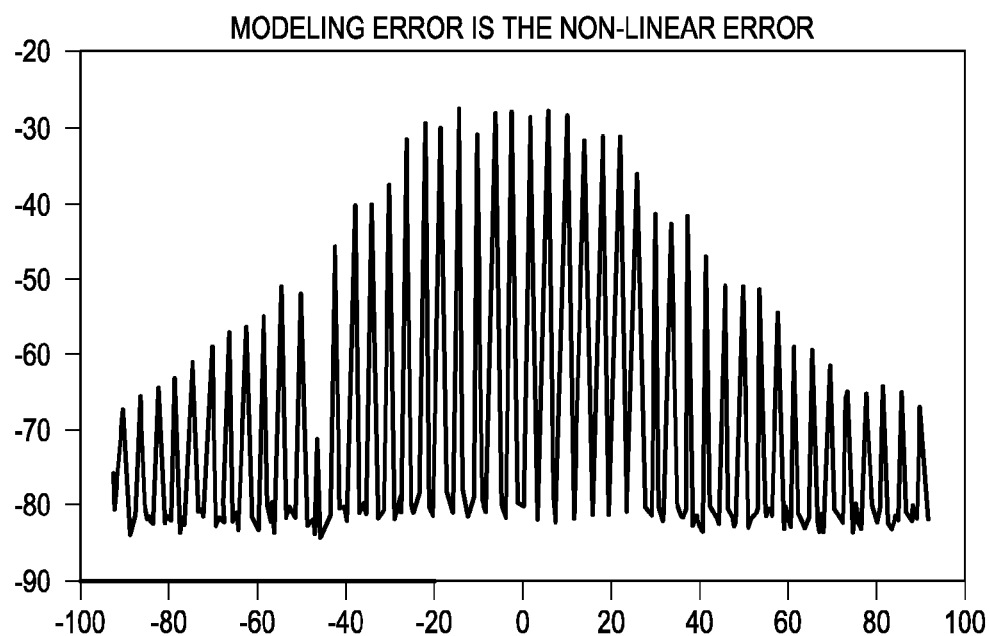
FIG. 7B is a signal diagram of a power spectral density curve of error used in DPD adaptation.

FIG. 7A provides a signal diagram of a received feedback signal, which includes PA non-linearity, linear channel distortion and feedback IQ imbalance. Signal 710 represents the power spectral density of the feedback signal. Signal 720 represents the output power spectral density of the linear impairment modeling. After subtracting the linear impairment, the error used for DPD adaptation, as shown in FIG. 7B, only contains the non-linear error. FIG. 7B provides a signal diagram of the power spectral density of the error used for the DPD training.

Figure 8:
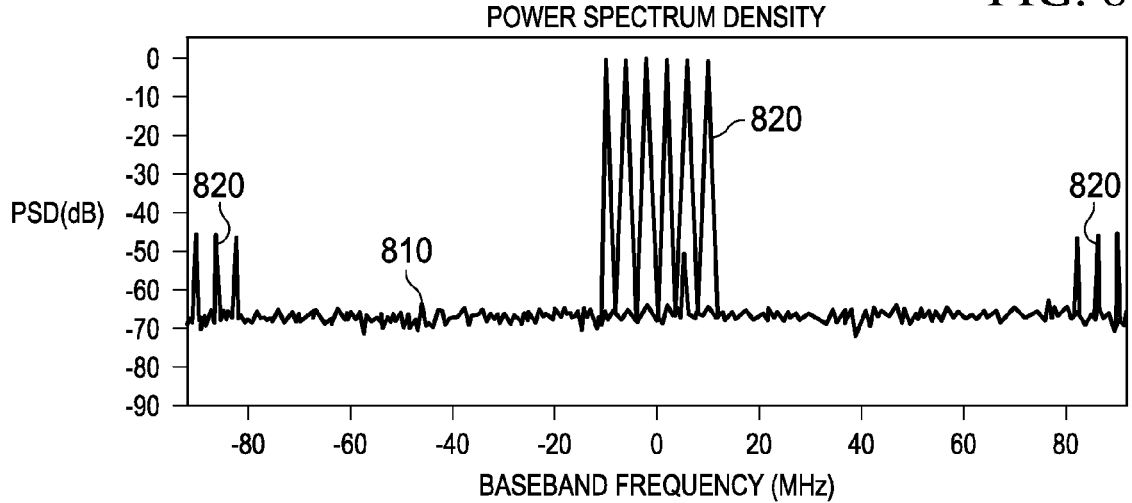
FIG. 8 is a signal diagram of a power spectral density curve of received signal after DPD adaptation.

FIG. 8 provides a signal diagram of the received feedback signal after DPD adaptation, in which the feedback signal only contains the linear components and their I/Q imbalance components as represented in signal 820. Signal 810 represents the error signal after feedback linear modeling as a noise floor. The linear impairments no longer contribute to the DPD error, which make the performance much more stable.

Figure 9:
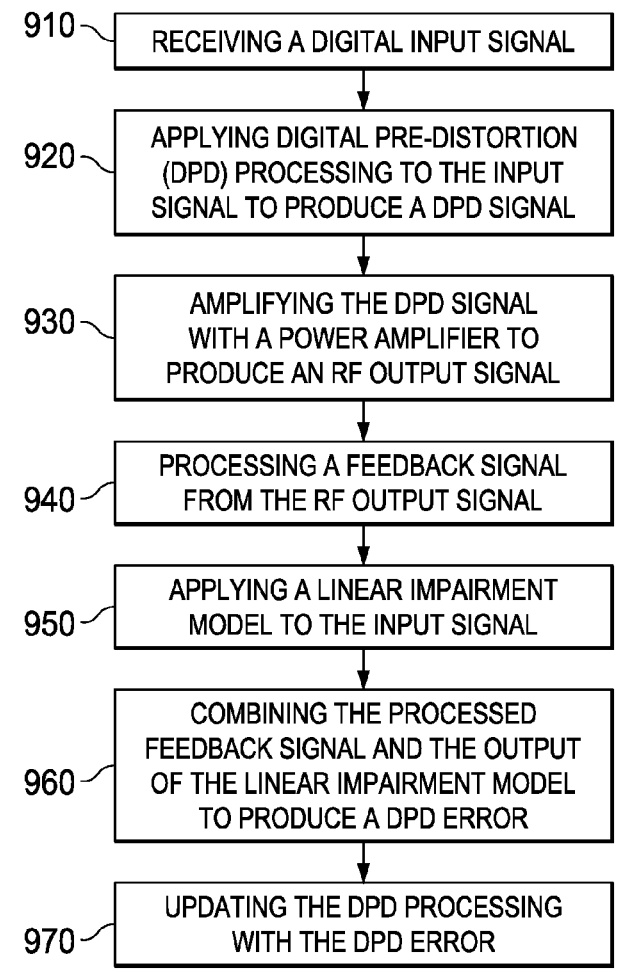
FIG. 9 is a flow diagram of an example embodiment of a method of linear impairment modeling to improve digital pre-distortion adaptation. performance

FIG. 9 provides flow diagram 900 of an example embodiment of a method of linear impairment modeling to improve digital pre-distortion adaptation performance. In block 910, a digital input signal is received. In block 920, digital pre-distortion (DPD) processing is applied to the input signal to produce a DPD signal. In block 930, the DPD signal is passed through the transmit interface to send to the transmit circuit and later amplified with a power amplifier to produce an RF output signal. In block 940, a feedback signal is processed from the feedback signal. In block 950, a linear impairment model is applied to the input signal. In block 960, the processed feedback signal is combined with the output of the linear impairment model to produce a DPD error. In block 970, the DPD processing is updated with the DPD error.

The flow chart of FIG. 9 shows the architecture, functionality, and operation of a possible implementation of the linear impairment modeling software. In this regard, each block represents a module, segment, or portion of code, which comprises one or more executable instructions for implementing the specified logical function(s). It should also be noted that in some alternative implementations, the functions noted in the blocks may occur out of the order noted in FIG. 9. For example, two blocks shown in succession in FIG. 9 may in fact be executed substantially concurrently or the blocks may sometimes be executed in the reverse order, depending upon the functionality involved. Any process descriptions or blocks in flow charts should be understood as representing modules, segments, or portions of code which include one or more executable instructions for implementing specific logical functions or steps in the process, and alternate implementations are included within the scope of the example embodiments in which functions may be executed out of order from that shown or discussed, including substantially concurrently or in reverse order, depending on the functionality involved. In addition, the process descriptions or blocks in flow charts should be understood as representing decisions made by a hardware structure such as a state machine.

The logic of the example embodiment(s) can be implemented in hardware, software, firmware, or a combination thereof. In example embodiments, the logic is implemented in software or firmware that is stored in a memory and that is executed by a suitable instruction execution system. If implemented in hardware, as in an alternative embodiment, the logic can be implemented with any or a combination of the following technologies, which are all well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc. In addition, the scope of the present disclosure includes embodying the functionality of the example embodiments disclosed herein in logic embodied in hardware or software-configured mediums.

Software embodiments, which comprise an ordered listing of executable instructions for implementing logical functions, can be embodied in any computer-readable medium for use by or in connection with an instruction execution system, apparatus, or device, such as a computer-based system, processor-containing system, or other system that can fetch the instructions from the instruction execution system, apparatus, or device and execute the instructions. In the context of this document, a "computer-readable medium" can be any means that can contain, store, or communicate the program for use by or in connection with the instruction execution system, apparatus, or device. The computer readable medium can be, for example but not limited to, an electronic, magnetic, optical, electromagnetic, infrared, or semiconductor system, apparatus, or device. More specific examples (a nonexhaustive list) of the computer-readable medium would include the following: a portable computer diskette (magnetic), a random access memory (RAM) (electronic), a read-only memory (ROM) (electronic), an erasable programmable read-only memory (EPROM or Flash memory) (electronic), and a portable compact disc read-only memory (CDROM) (optical). In addition, the scope of the present disclosure includes embodying the functionality of the example embodiments of the present disclosure in logic embodied in hardware or software-configured mediums.

Although the present invention has been described in detail, it should be understood that various changes, substitutions and alterations can be made thereto without departing from the spirit and scope of the invention as defined by the appended claims.

Therefore, at least the following is claimed:
1. A process comprising:
   receiving a digital input signal;
   producing a digital pre-distortion signal from the digital input signal in response to a non-linear impairment digital pre-distortion error signal;
   amplifying the digital pre-distortion signal with a power amplifier to produce a radio frequency output signal;

producing from the radio frequency output signal a digital feedback signal that includes linear impairments and non-linear impairments;

separating the linear impairments from the non-linear impairments;

subtracting the linear impairments from the digital feedback signal to result in a non-linear impairment digital pre-distortion error signal; and updating the producing a digital pre-distortion signal from the digital input signal in response to the non-linear impairment digital pre-distortion error signal from the subtracting.

2. The process of claim 1 including converting the digital pre-distortion signal into an analog signal, mixing the analog signal with a signal from a local oscillator, power amplifying the mixed analog signal to form the radio frequency output signal, and applying radio frequency output signal to an antennae.

3. The process of claim 1 in which the producing from the radio frequency output signal includes receiving an analog signal from an amplified signal applied to an antennae, de-mixing the analog feedback signal with a signal from a local oscillator, and converting the de-mixed signal to the digital feedback signal.

4. A system comprising:
a digital pre-distortion module having a digital signal input, an update input, and a filtered signal output;
a power amplifier having a filtered signal input coupled to the filtered signal output, and having a radio frequency signal output;
a feedback post-processing module having an input coupled to the radio frequency signal output, and having a processed signal output;
a linear impairment modeling module having an input coupled to the digital signal input and having a linear error signal output;
an error module having an input coupled to the processed signal output, an input coupled to the linear error signal output, and a non-linear error signal output; and
a digital pre-distortion adaptation engine having an input coupled to the non-linear error signal output and an output coupled to the update input.

5. The system of claim 4 in which at least one of the digital pre-distortion module, the feedback post-processing module, the linear impairment modeling module, and the digital pre-distortion adaptation engine are embodied in a digital signal processor.

6. The system of claim 4 in which the linear impairment modeling module includes an input coupled to the feedback post-processing module.

* * * * *